US012704777B2

(12) United States Patent
Abe et al.

(10) Patent No.: US 12,704,777 B2
(45) Date of Patent: Aug. 11, 2026

(54) METHOD OF GENERATING DROP RECIPE, IMPRINTING METHOD, AND METHOD OF MANUFACTURING SEMICONDUCTOR DEVICE

(71) Applicant: Kioxia Corporation, Tokyo (JP)

(72) Inventors: Katsuya Abe, Yokkaichi Mie (JP); Kazuya Fukuhara, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 168 days.

(21) Appl. No.: 18/825,726

(22) Filed: Sep. 5, 2024

(65) Prior Publication Data

US 2025/0291244 A1 Sep. 18, 2025

(30) Foreign Application Priority Data

Mar. 14, 2024 (JP) ................................ 2024-040431

(51) Int. Cl.
*G03F 7/00* (2006.01)
*G03F 7/16* (2006.01)
*H10P 50/00* (2026.01)
*H10P 76/20* (2026.01)

(52) U.S. Cl.
CPC ............ *G03F 7/0002* (2013.01); *H10P 50/73* (2026.01); *H10P 76/204* (2026.01)

(58) Field of Classification Search
CPC ...... G03F 7/0002; G03F 7/16; G03F 7/70491; H10P 76/20; H10P 76/2041; H10P 76/204; H10P 50/73
See application file for complete search history.

(56) References Cited

U.S. PATENT DOCUMENTS

| | | | |
|---|---|---|---|
| 8,562,323 | B2 | 10/2013 | Ito et al. |
| 2018/0329315 | A1 | 11/2018 | Hirano |
| 2021/0294224 | A1 | 9/2021 | Kusaka |

FOREIGN PATENT DOCUMENTS

| | | | |
|---|---|---|---|
| JP | 5409813 B2 | 2/2014 | |
| JP | 2018-73989 A | 5/2018 | |
| JP | 2018-195811 A | 12/2018 | |
| JP | 2021-150457 A | 9/2021 | |

*Primary Examiner* — Galen H Hauth
*Assistant Examiner* — Baileigh Kate Darnell
(74) *Attorney, Agent, or Firm* — Finnegan, Henderson, Farabow, Garrett & Dunner, LLP

(57) ABSTRACT

A method of generating a drop recipe includes: acquiring first information indicating a position of a step and second information indicating a position of an outer edge of the substrate, in a first shot area among shot areas provided on a substrate; setting third information indicating a first area between the step and the outer edge, based on the first information and the second information; setting fourth information indicating a second area between the step and a first position located inside of the substrate by a first distance from the step, based on the first information; and changing the drop recipe so that droplets do not exist in the first and second areas and a density of droplets located near an inside of the first position is higher than a density of droplets located other than near the inside of the first position within the inside of the first position.

15 Claims, 8 Drawing Sheets

87
23
22
21
110d
60
50
40
30
20
SH
SH 10
110d
10p
60
50
40
30
20
SH
SH 110s
10
60
50
40
30
20
SH
SH 83a
20ei
22i
SHc
110d
110d
110d
83a
20ei
22i
SHc
110d
110d
110d
83a
A1
A2
D1
D2
D3
A3
20ei
22i
L1
L2
83a
A1
A2
D1
D2
D3
A3
20ei
22i
L1
L2
110d
110d
110d
83a
A1
A2
D1
D2
D3
A3
20ei
22i
L1
L2
110d
110d
110d
20e
23
22
21
20ei
22i
110d
60
50
40
30
20
SH

METHOD OF GENERATING DROP RECIPE, IMPRINTING METHOD, AND METHOD OF MANUFACTURING SEMICONDUCTOR DEVICE

CROSS-REFERENCE TO RELATED APPLICATIONS

This application is based upon and claims the benefit of priority from Japanese Patent Application No. 2024-040431, filed on Mar. 14, 2024; the entire contents of which are incorporated herein by reference.

FIELD

Embodiments described herein relate generally to a method of generating a drop recipe, an imprinting method, and a method of manufacturing a semiconductor device.

BACKGROUND

A manufacturing process of a semiconductor device may include an imprinting process. In the imprinting process, a pattern of a template is transferred to a resist material etc. dropped onto a shot area of a substrate. There may be an incomplete shot where a portion of the shot area is missing on the outer periphery of the substrate. A portion, a planar dimension, etc. where the missing part may be different between incomplete shots, and when an amount and a dropping position of resist material similar to them of a normal shot area are applied to the incomplete shots, the imprinting process may cause defects.

DETAILED DESCRIPTION

In general, according to one embodiment, a method of generating a drop recipe is used for an imprinting process on a substrate including a step on an outer periphery. The method includes: acquiring first information indicating a position of the step and second information indicating a position of an outer edge of the substrate, in a first shot area including the step among a plurality of shot areas provided on the substrate; setting third information indicating a first area between the step and the outer edge of the substrate, based on the first information and the second information acquired; setting fourth information indicating a second area between the step and a first position located inside of the substrate by a first distance from the step, based on the first information; and changing the drop recipe, in which dropping positions of a plurality of droplets onto the substrate are set to uniform density, in such a manner that droplets do not exist in the first and second areas prescribed by the third information and the fourth information and a density of droplets located near an inside of the first position is higher than a density of droplets located other than near the inside of the first position within the inside of the first position.

Exemplary embodiments of a method of generating a drop recipe, an imprinting method, and a method of manufacturing a semiconductor device will be explained below in detail with reference to the accompanying drawings. The present invention is not limited to the following embodiments. Moreover, components according to the following embodiments include ones that can be easily assumed by those skilled in the art or substantially the same ones.

(Configuration Example of Imprinting Apparatus)

Figure 1:
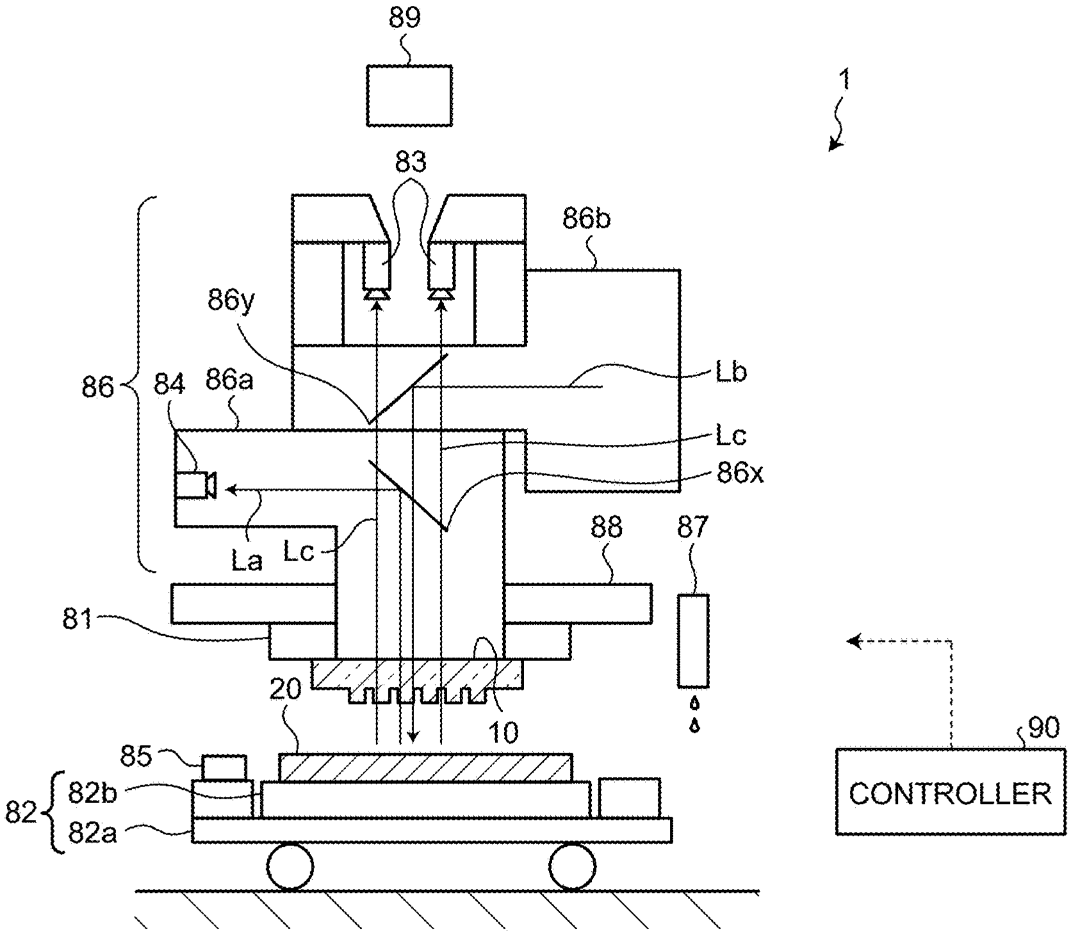
FIG. 1 is a schematic diagram illustrating an example of a configuration of an imprinting apparatus according to an embodiment.

FIG. 1 is a schematic diagram illustrating an example of a configuration of an imprinting apparatus 1 according to an embodiment.

As illustrated in FIG. 1, the imprinting apparatus 1 includes a template stage 81, a wafer stage 82, imaging devices 83 and 84, a reference mark 85, an alignment device 86, a liquid dropping device 87, a stage base 88, a light source 89, and a controller 90.

A template 10 that transfers a pattern to a resist on a wafer 20 can be attached to the imprinting apparatus 1. Various processes including a process in the imprinting apparatus 1 are performed on the wafer 20 to manufacture a semiconductor device. Such the wafer 20 may be a semiconductor substrate, an insulating substrate, a conductive substrate, or the like.

The wafer stage 82 includes a wafer chuck **82*b* and a body 82*a*. The wafer chuck 82*b* is configured as a suction chuck that sucks the wafer 20 to adsorb the wafer at a predetermined position on the body 82*a*. The reference mark 85 is provided on the wafer stage 82. The reference mark 85 is used for position alignment when loading the wafer 20 onto the wafer stage 82**.

The wafer stage 82 places thereon the wafer 20 and moves within a plane (horizontal plane) parallel to the placed wafer 20. The wafer stage 82 moves the wafer 20 to the lower side of the liquid dropping device 87 when dropping a resist onto the wafer 20, and moves the wafer 20 to the lower side of the template 10 when performing a transfer process on the wafer 20.

The stage base 88 supports the template 10 by using the template stage 81, and moves the template in the up-down direction (vertical direction) to press a pattern of the template 10 onto the resist on the wafer 20.

The alignment device 86 including the plurality of imaging devices 83 is provided on the stage base 88. Based on alignment marks respectively provided on the wafer 20 and the template 10, the alignment device 86 performs a position detection of the wafer 20 and a position detection of the template 10.

The alignment device 86 includes a detection system 86*a* and an illumination system 86*b*. The illumination system 86*b* shines light on the wafer 20 and the template 10, and causes the alignment marks formed on them to be visible. The detection system 86*a* detects images of the alignment marks, and aligns positions of them to perform position alignment between the wafer 20 and the template 10.

The detection system 86*a* and the illumination system 86*b* respectively include mirrors 86*x* and 86*y* such as dichroic mirrors, which act as an image formation device. The mirrors 86*x* and 86*y* form images of the alignment marks etc. from the wafer 20 and the template 10 by using the light from the illumination system 86*b*.

Specifically, light Lb from the illumination system 86*b* is reflected by the mirror 86*y* to the lower side on which the wafer 20 etc. are arranged. Moreover, light La from the wafer 20 etc. is reflected by the mirror 86*x* toward the detection system 86*a*. Moreover, light Lc that is part of light from the wafer 20 etc. passes through the mirrors 86*x* and 86*y* and advances toward the upper imaging device 83.

The imaging device 83 captures the light Lc as an image including the alignment mark etc. The image captured by the imaging device 83 is analyzed by the controller 90 to perform position alignment between the wafer 20 and the template 10.

On the other hand, the light La reflected toward the detection system 86*a* by the mirror 86*x* advances toward the imaging device 84 included in the detection system 86*a*.

The imaging device 84 captures the light La reflected by the mirror 86*x* as an image including the alignment mark etc. The image captured by the imaging device 84 is analyzed by the controller 90 to perform the position alignment between the wafer 20 and the template 10.

The liquid dropping device 87 is a device that drops resist onto the wafer 20 in an ink-jet method. An ink-jet head included in the liquid dropping device 87 includes a plurality of micropores that eject droplets of the resist, and drops the droplets of the resist onto a shot area on the wafer 20.

The light source 89 is a device that irradiates light such as ultraviolet rays of hardening resist, for example, and is provided above the stage base 88. The light source 89 irradiates the light from above the template 10 in a state where the template 10 is pressed on the resist.

The controller 90 is configured as a computer that includes a hardware processor such as a central processor (CPU), a memory, a hard disk drive (HDD), and the like. The controller 90 controls the template stage 81, the wafer stage 82, the reference mark 85, the alignment device 86 including the imaging devices 83 and 84, the liquid dropping device 87, the stage base 88, and the light source 89.

Next, a configuration example of the wafer 20 to be processed by the imprinting apparatus 1 will be described with reference to FIGS. 2A and 2B.

Figure 2A:
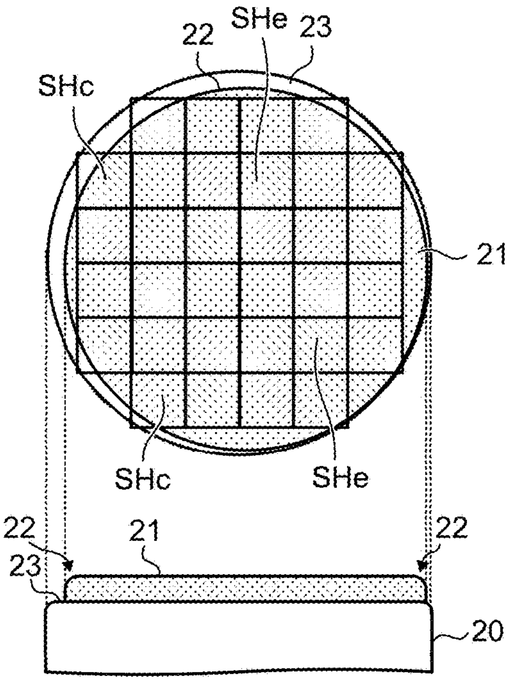
FIGS. 2A and 2B are schematic diagrams illustrating an example of a configuration of a wafer processed by the imprinting apparatus according to the embodiment.
Figure 2B:
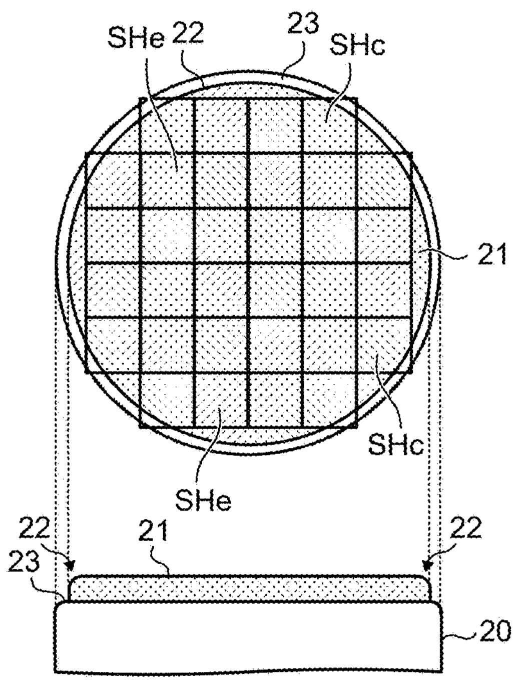

FIGS. 2A and 2B are schematic diagrams illustrating an example of a configuration of the wafer 20 processed by the imprinting apparatus 1 according to the embodiment. In more detail, in each drawing of FIGS. 2A and 2B, an upper portion illustrates a top view of the wafer 20, and a lower portion illustrates a side-sectional view of the wafer 20.

As illustrated in FIGS. 2A and 2B, the wafer 20 has a convex area 21, where a plurality of layers are stacked, in a portion excluding the outer periphery. Before a process in the imprinting apparatus 1, a plurality of processes are already performed on the wafer 20, for example. The plurality of layers of the convex area 21 may include an insulating layer, a conducting layer, a semiconductor layer, etc. formed by these processes.

An edge area 23 obtained by removing these layers is provided on the outer periphery of the wafer 20. By removing some or all of the plurality of layers that form the convex area 21, the surface of the wafer 20 that is a silicon substrate etc. is exposed in the edge area 23, for example. Thus, the convex area 21 protrudes from the surface of the wafer 20, and the wafer 20 has a step 22, which becomes lower toward the edge area 23 from the convex area 21, at a boundary portion between the convex area 21 and the edge area 23. The height of such the step 22 is a micron order, for example.

The step 22 of the wafer 20 surrounds the outer periphery of the wafer 20 in an annular shape to surround the outer periphery. The convex area 21 partitioned from the edge area 23 by the step 22 has a substantially similar shape to the wafer 20, and is a circular area when viewed from the top of the wafer 20. In this regard, however, the center point of the convex area 21 and the center point of the wafer 20 viewed from the top of the wafer 20 are not necessarily identical to each other.

FIG. 2A illustrates an example when the center point of the convex area 21 is not identical with the center point of the wafer 20. In the example of FIG. 2A, the convex area 21 is eccentric to the wafer 20 toward the bottom right of the page. Thus, the width of the edge area 23 varies in accordance with the outer circumferential position of the wafer 20. In other words, in the example of FIG. 2A, the width of the edge area 23 is maximized at the outer circumferential position at the top left of the page, and the width of the edge area 23 is minimized at the outer circumferential position at the bottom right of the page.

FIG. 2B illustrates an example when the center point of the convex area 21 is identical with the center point of the wafer 20. In this case, the width of the edge area 23 is substantially constant at any outer circumferential position of the wafer 20.

Moreover, the top surface of the wafer 20 is partitioned into a plurality of shot areas SH (SHe, SHc) by the previous processes. The plurality of shot areas SH are arranged on the substantially entire surface of the wafer 20 in a reticular pattern. Among these shot areas SH, each of shot areas SHe arranged in an area excluding the outer periphery of the wafer 20 has a rectangular shape, for example. On the other hand, some shot areas SHc arranged on the outer periphery of the wafer 20 are a incomplete shot whose portion protrudes from the convex area 21.

Each of these shot areas SH is an area as a processing unit per once in some processes including an imprinting process among a plurality of manufacturing processes of the semiconductor device. In other words, in the imprinting process to be described later, for example, a process of transferring the pattern of the template 10 is performed for each of the shot areas SH. In the final stage of the manufacturing process of the semiconductor device, one or more semiconductor chips are separated from the individual shot areas SH, and one or more semiconductor devices are obtained.

The plurality of shot areas SH arranged on the wafer 20 in a reticular pattern are formed so that the entire center point of these shot areas SH is identical with the center point of the wafer 20. Therefore, the convex area 21 of the wafer 20 may be also eccentric to the plurality of shot areas SH. Thus, the example illustrated in FIG. 2A where the convex area 21 is eccentric to the shot areas SH and the example illustrated in FIG. 2B where the convex area 21 is not eccentric to the shot areas SH have different relative positional relationships between the step 22 and the individual shot areas SH. Along with this, the some shot areas SHc on the outer periphery of the wafer 20 have different planar dimensions, shapes, etc.

(Method of Manufacturing Semiconductor Device)

Next, a method of manufacturing the semiconductor device according to the embodiment will be described with reference to FIGS. 3A to 7F. The manufacturing processes of the semiconductor device according to the embodiment include an edge-bead removal (EBR) process of the wafer 20 and an imprinting process by the above imprinting apparatus 1.

FIGS. 3A to 3D are cross-sectional views sequentially illustrating some of procedures in the edge bead removal process of the wafer 20 according to the embodiment.

Figure 3A:
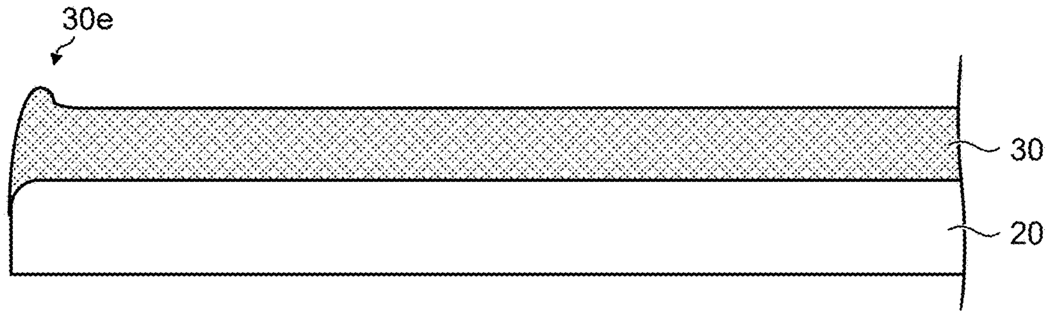
FIGS. 3A to 3D are cross-sectional views sequentially illustrating some of procedures in an edge bead removal process of the wafer according to the embodiment.

As illustrated in FIG. 3A, a plurality of layers 30 including the insulating layer, the conducting layer, the semiconductor layer, etc. are formed on the target wafer 20 of the imprinting process by the previous processes, for example. As described above, when the processes of forming various layers are repeated multiple times, an edge bead 30*e* where the layer thickness of the plurality of layers 30 is generally thickened may occur on the outer periphery of the wafer 20. The edge bead 30*e* may cause various defects in the subsequent processes. Therefore, as described below, it is preferable to remove the edge bead as appropriate at a predetermined time.

Figure 3B:
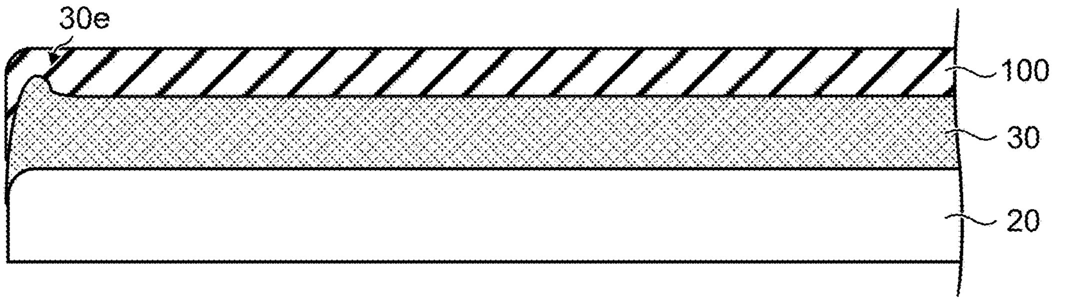

As illustrated in FIG. 3B, a photoresist layer 100 covering the entire surface of the wafer 20 is formed on the plurality of layers 30.

Figure 3C:
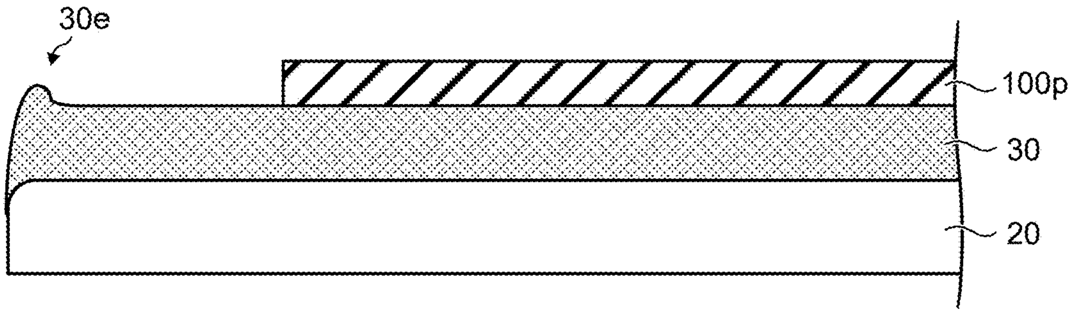

As illustrated in FIG. 3C, a resist pattern 100*p* is formed by removing the photoresist layer 100 on the outer periphery of the wafer 20 by a predetermined width. Thus, the outer circumferential portion of the plurality of layers 30 including the edge bead 30*e* is exposed.

The photoresist layer 100 on the outer periphery of the wafer 20 is removed by exposing the outer periphery of the wafer 20 or by discharging removal liquid of dissolving the photoresist layer 100 to the outer periphery of the wafer 20, for example.

An exposure process for the outer periphery of the wafer 20 is performed on the photoresist layer 100 before exposure and development processes. In other words, while rotating the wafer 20 on a spinner by using the center point of the wafer 20 viewed from the top surface as a rotation axis, for example, exposure light such as laser light is irradiated to the outer periphery. Thus, the photoresist layer 100 on the outer periphery of the wafer 20 is exposed by a predetermined width, and then is removed by performing the development process.

A dissolution process for the photoresist layer 100 is performed on the photoresist layer 100 after the exposure and development processes. In other words, like the above, the removal liquid is discharged to the outer periphery while rotating the wafer 20 on the spinner by using the center point of the wafer 20 as a rotation axis. Thus, the photoresist layer 100 on the outer periphery of the wafer 20 is dissolved and removed by the predetermined width.

Note that, even when using any of the methods, a minute deviation may occur in the rotation axis of the spinner and the center point of the wafer 20 when holding the wafer 20 on the spinner, for example. In this case, the center point of the resist pattern 100*p* where the outer periphery is removed is not identical with the center point of the wafer 20, and thus the resist pattern 100*p* is eccentric to the wafer 20. Thus, the removal width of the photoresist layer 100 on the outer periphery of the wafer 20 varies in accordance with the outer circumferential position of the wafer 20.

Figure 3D:
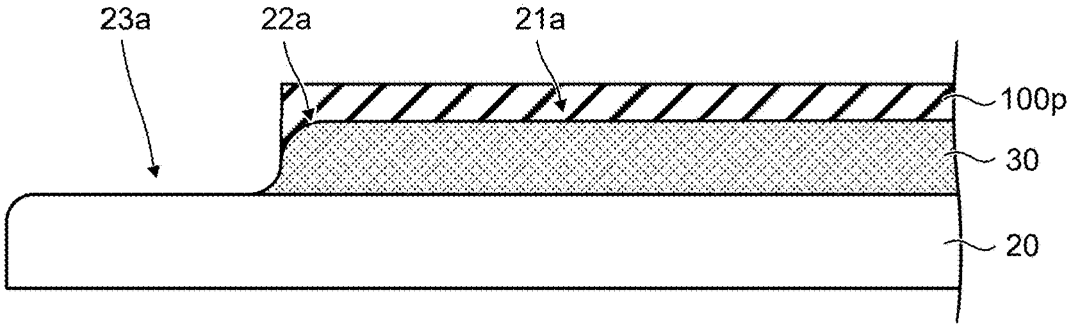

As illustrated in FIG. 3D, the edge bead 30*e* formed on the plurality of layers 30 is removed by performing an etching process on the plurality of layers 30 exposed from the resist pattern 100*p*. In other words, the surface layer of the substrate exposed from the resist pattern 100*p* is removed. At this time, the etching process may be performed until all of the plurality of layers 30 on the wafer 20 are removed and the surface of the wafer 20 is exposed, or the lower portion of the plurality of layers 30 may remain on the wafer 20 by removing the upper portion thereof.

As described above, an edge area 23*a* where the plurality of layers 30 are removed and a convex area 21*a* convexly raised relative to the edge area 23*a* are formed on the wafer 20, and a step 22*a* is formed between the edge area 23*a* and the convex area 21*a*.

Note that the convex area 21 is also formed eccentrically to the wafer 20 when the resist pattern 100*p* is formed eccentrically to the wafer 20.

The above edge-bead removal process is performed from time to time during the manufacturing process of the semiconductor device as appropriate. Therefore, the edge-bead removal process may be performed once or more at a predetermined timing until the imprinting process is performed. On this occasion, the imprinting process may be performed immediately after the edge-bead removal process is performed, or the imprinting process may be performed after the edge-bead removal process is performed and then some processes are further performed.

At this time, the convex area 21*a*, the step 22*a*, and the edge area 23*a* are also inherited to the wafer 20 subject to the imprinting process, and thus the wafer 20 to be processed has the convex area 21, the step 22, and the edge area 23 described above.

FIGS. 4A to 5C are cross-sectional views sequentially illustrating some of procedures in the imprinting process by the imprinting apparatus 1 according to the embodiment.

Before starting the imprinting process, the template 10 and the wafer 20 are taken into the imprinting apparatus 1, the template 10 is mounted on the template stage 81, and the wafer 20 is placed on the wafer stage 82.

Figure 4A:
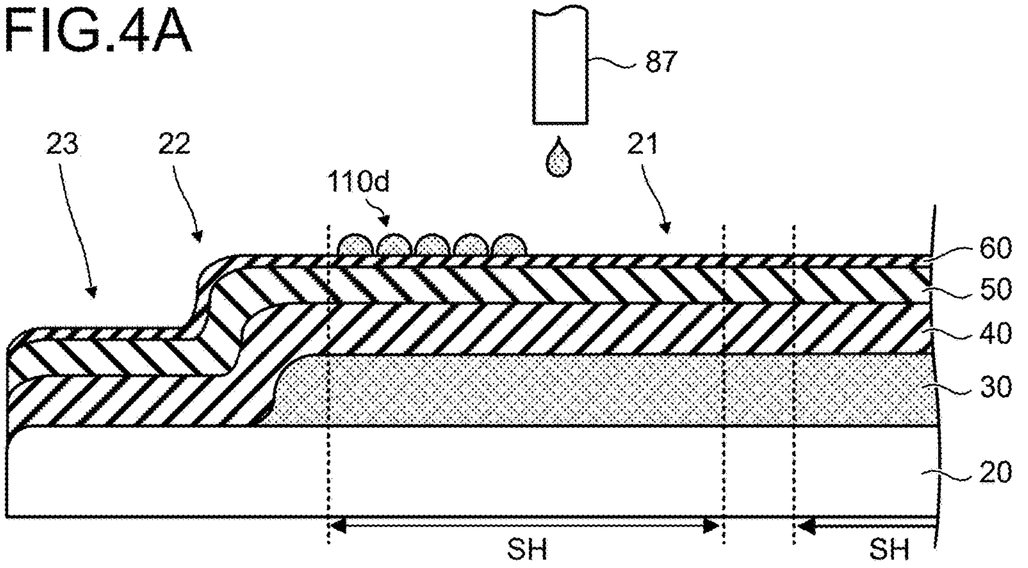
FIGS. 4A to 4C are cross-sectional views sequentially illustrating some of procedures in an imprinting process by the imprinting apparatus according to the embodiment.

As illustrated in FIG. 4A, a processed layer 40 covering the plurality of layers 30 with the edge-bead removal process, an SOC (spin on carbon) layer 50, and an SOG (spin on glass) layer 60 are formed on the entire surface of the wafer 20 taken into the imprinting apparatus 1 in this order from the wafer 20 side, for example.

The processed layer 40 is a layer processed into a pattern transferred to the wafer 20 by the imprinting process, and is, for example, an insulating layer such as a silicon oxide layer. The SOC layer 50 is an organic layer including carbon as a main material. The SOG layer 60 is an inorganic layer such as a silicon oxide layer. Any of the SOC layer 50 and the SOG layer 60 is formed by a spin coating method, for example.

These layers are formed on the convex area 21*a*, the step 22*a*, and the edge area 23*a* along the step 22*a* provided on the wafer 20 by the above edge-bead removal process. Thus, the step 22 is also formed for each of these layers, and the convex area 21 and the edge area 23 are formed by using the step 22 as a boundary.

Moreover, the plurality of shot areas SH are provided on the wafer 20 on which these layers are formed, as described above. The imprinting apparatus 1 sequentially executes the imprinting process to be described below on these shot areas SH.

Droplets 110*d* such as resist material are dropped onto the shot area SH to be processed among the plurality of shot areas SH by the liquid dropping device 87 of the imprinting apparatus 1. The droplets 110*d* of resist material are light-hardening photoresist, for example, and are dropped onto the wafer 20 in a liquid state before hardening. Thus, the plurality of droplets 100*d* are dispersed and arranged over the entire area of the shot area SH.

The imprinting apparatus 1 holds a drop recipe in which a droplet volume, the number of droplets, dropping positions, etc. of the droplets 110*d* onto one of the shot areas SH are prescribed. The drop recipe prescribes dropping positions so that droplets are dropped at a predetermined periodic in a staggered shape, a grid shape, etc. when viewed from the top surface over the entire area of the rectangular shot area SHe without a missing part (see FIGS. 2A and 2B) for example. In other words, in the drop recipe, the dropping positions of the individual droplets 110*d* are set so that the droplets are theoretically dropped with substantially uniform density over the entire area of the shot area SHe for example.

Note that "substantially" uniform in the present specification means that the density of the droplets 110*d* prescribed in the drop recipe is completely uniform and furthermore the density includes a predetermined deviation. "Density" indicates the drop placement density, which is a volume of drops per unit area. For example, when 0.93 pl of one drop is periodically placed per 40000 $\mu m^2$ area, the density is $2.3\times10^{-5}$ pl/$\mu m^2$.

In this regard, however, even if the droplets 110*d* are dropped by using the drop recipe set to cause the droplets 110*d* to have uniform density as described above for example, the density of the droplets 110*d* to be actually dropped onto the wafer 20 may not be necessarily completely uniform. The actual density of the droplets 110*d* on the wafer 20 may vary within a predetermined range in accordance with the dropping accuracy of the liquid dropping device 87, the drive accuracy of the wafer stage 82, the flatness of the wafer 20, and the like, for example.

Moreover, when the shot area SHc (see FIGS. 2A and 2B reference) provided on the outer periphery of the wafer 20 and having the missing part among the plurality of shot areas SH is the imprinting process target, the dropping of the droplets 110*d* is performed after the drop recipe prescribed based on the shot area SHe without a missing part is corrected as appropriate. The details of the correction method of the drop recipe will be described below.

Figure 4B:
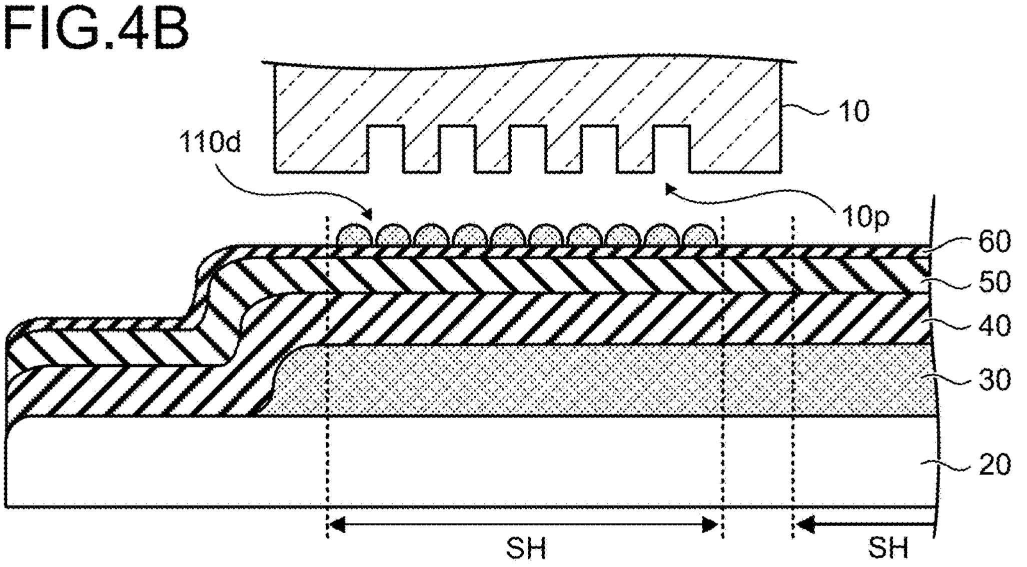

As illustrated in FIG. 4B, after the plurality of droplets 110*d* are dropped onto the shot area SH to be processed in accordance with the drop recipe, the template 10 taken into the imprinting apparatus 1 and mounted on the template stage 81 is arranged at a position vertically facing the shot area SH.

The template 10 is mounted on the template stage 81 with its surface having a predetermined pattern 10*p* facing the wafer 20. The pattern 10*p* provided on the template 10 can appropriately vary in accordance with a pattern to be formed on the processed layer 40, such as a line and space pattern, a dot pattern, a hole pattern, etc.

As described above, in a state where the template 10 is opposed to the wafer 20 apart from the wafer by a predetermined distance, the imaging device 83 of the imprinting apparatus 1 performs rough alignment while observing the alignment marks provided on the template 10 and the wafer 20, for example.

As described above, the rough alignment is a process that roughly performs position alignment so that the alignment marks provided on the template 10 and the wafer 20 overlap each other in the state where they are separated.

Figure 4C:
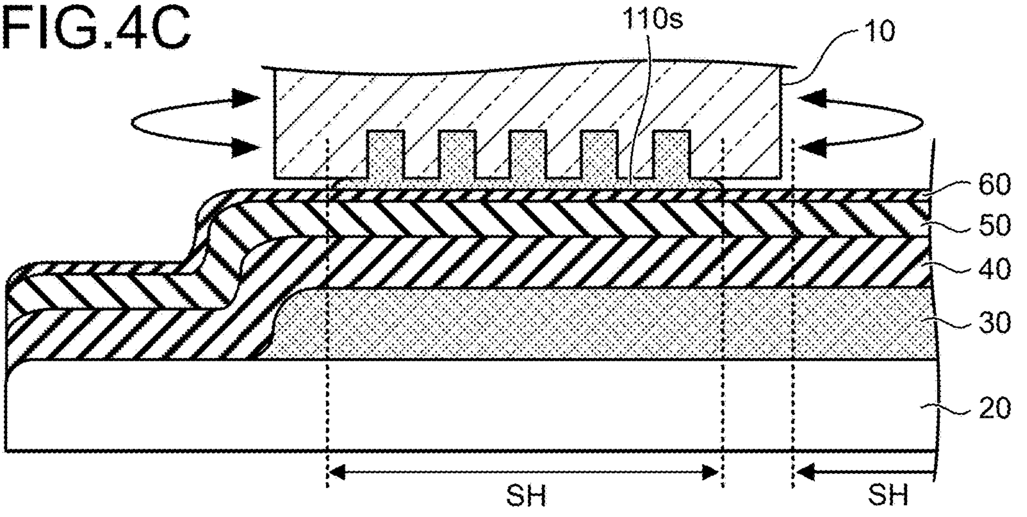

As illustrated in FIG. 4C, after completing the rough alignment, the pattern 10*p* of the template 10 is brought into contact with the plurality of droplets 110*d* on the wafer 20. At this time, the template 10 is held above the wafer 20 while leaving a slight gap between the template and the uppermost SOG layer 60 of the wafer 20.

After this, until the imprinting process is completed, the template 10 is maintained at a height position having a slight interval between the wafer 20 and the template. Thus, the template 10 is prevented from contacting the wafer 20 to damage the wafer 20.

By pressing the template 10, the plurality of droplets 110*d* are crushed and expanded to form a resist layer 110*s* obtained by substantially integrating the entire of the plurality of droplets 110*d*. Moreover, a portion of the resist layer 110*s* gradually fills an uneven portion of the pattern 10*p* provided on the template 10 by a capillary phenomenon.

When the situation is observed by, for example, the imaging device 83 and the resist layer 110*s* substantially completely fills the unevenness of the pattern 10*p*, the fine alignment is performed while observing the alignment marks provided on the template 10 and the wafer 20 by the imaging device 84 for example.

As described above, the fine alignment is a process of performing more precise position alignment so that the template 10 is made slide along the surface of the wafer 20 to overlap the alignment marks provided on the template 10 and the wafer 20 in the state where the template is brought into contact with the resist layer 110*s*.

Note that performing the fine alignment after the resist layer 110*s* fills the unevenness of the pattern 10*p* is because the visibility of the alignment mark is improved by filling in the unevenness of the pattern 10*p*. In this regard, however, filling in the unevenness of the pattern 10*p* with the resist layer 110*s* and the fine alignment may be concurrently performed. Thus, it is possible to improve the throughput of the imprinting process.

Figure 5A:
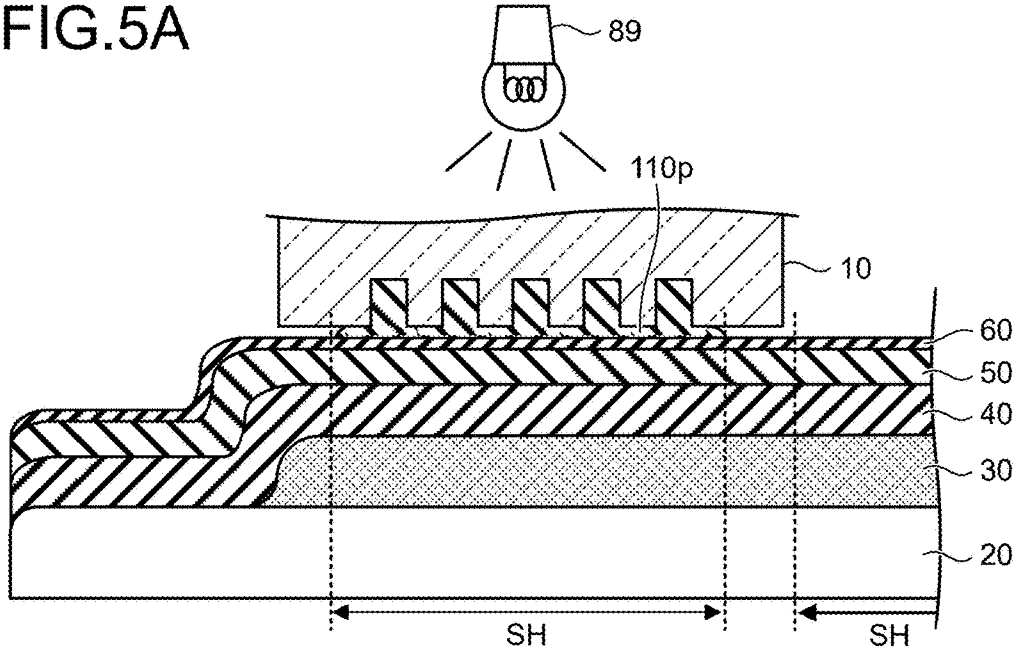
FIGS. 5A to 5C are cross-sectional views sequentially illustrating some of procedures in the imprinting process by the imprinting apparatus according to the embodiment.

As illustrated in FIG. 5A, after completing the fine alignment, light such as ultraviolet rays from the light source 89 of the imprinting apparatus 1 is irradiated from the upper side of the template 10 to harden the resist layer 110*s*. Thus, the pattern 10*p* of the template 10 is transferred to the resist layer 110*s* to form a resist pattern 110*p*.

Figure 5B:
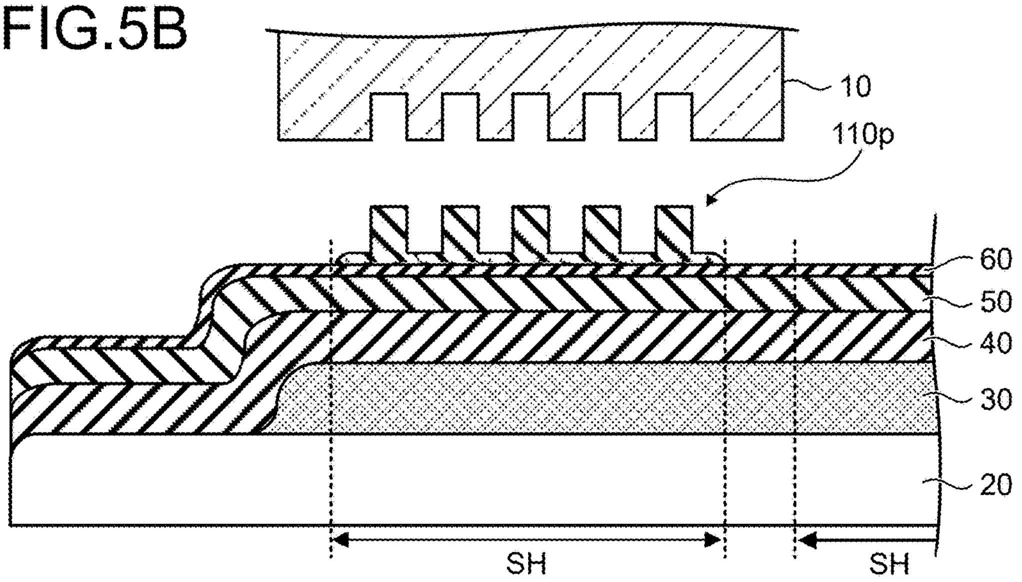

As illustrated in FIG. 5B, the template 10 is released from the resist pattern 110*p*.

Figure 5C:
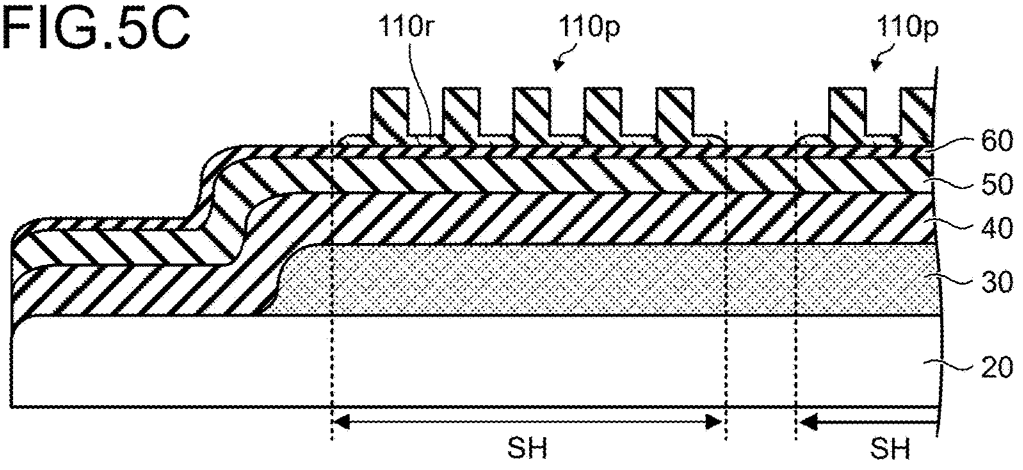

As illustrated in FIG. 5C, the above imprinting process is sequentially executed on the plurality of shot areas SH on the wafer 20 to form the resist pattern 110*p* for each of the shot areas SH. Note that the resist pattern 110*p* is formed to have a resist residual film 110*r* on a basal portion between convex portions of the pattern. As described above, the resist residual film 110*r* is formed because the template 10 is maintained at the height position having a slight gap between the wafer 20 and the template during the imprinting process.

When the imprinting process for all the shot areas SH provided on the wafer 20 is completed, the template 10 and the wafer 20 are taken out from the imprinting apparatus 1. The wafer 20 taken out from the imprinting apparatus 1 proceeds to processes illustrated in FIGS. 6A to 6C.

Figure 6A:
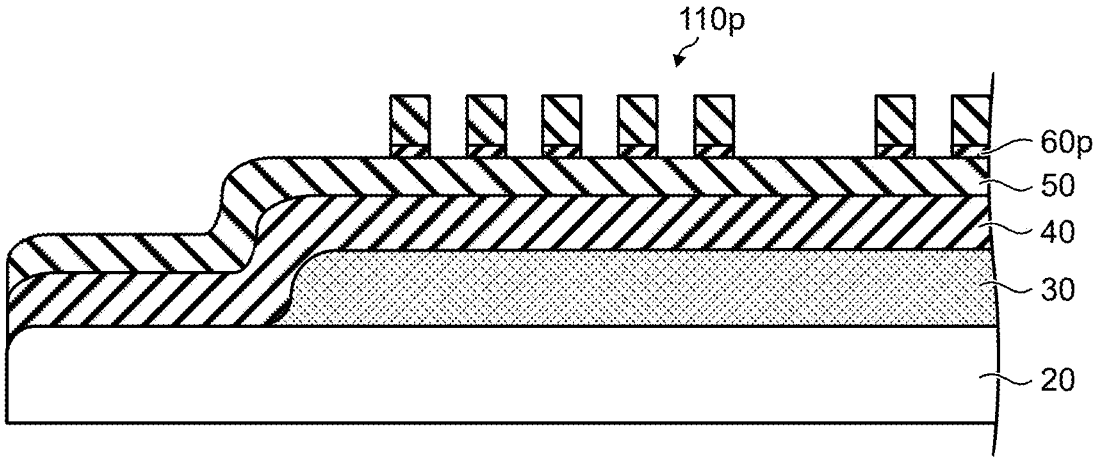
FIGS. 6A to 6C are cross-sectional views sequentially illustrating some of procedures in an etching process of a processed layer according to the embodiment.
Figure 6B:
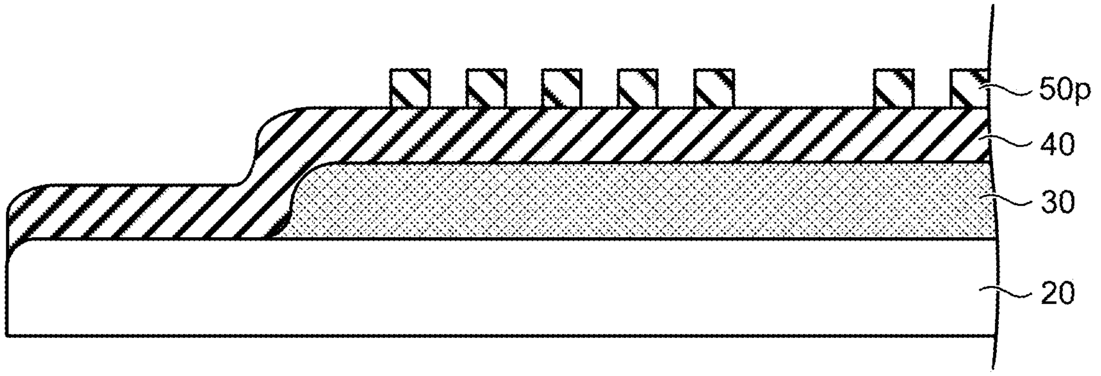
Figure 6C:
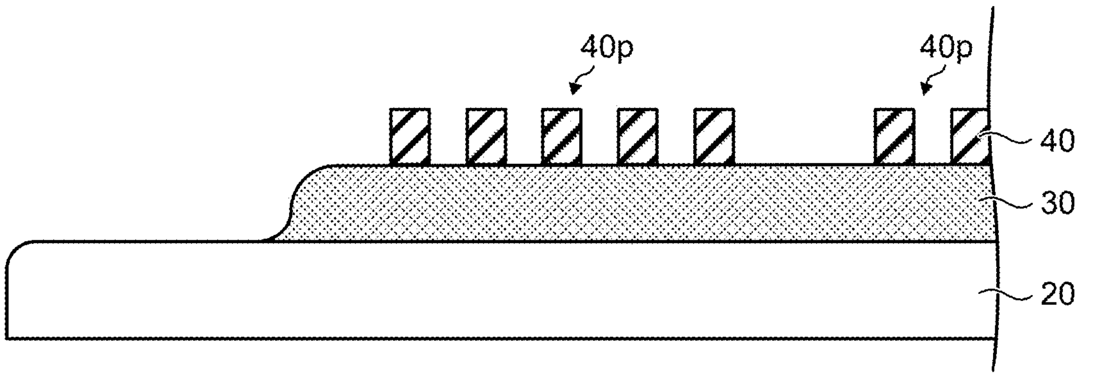

FIGS. 6A to 6C are cross-sectional views sequentially illustrating some of procedures in the etching process of the processed layer 40 according to the embodiment.

As illustrated in FIG. 6A, the resist residual film 110*r* of the resist pattern 110*p* is removed by using a method such as reactive ion etching (RIE), and the exposed SOG layer 60 is etched to form an SOG pattern 60*p* in which the resist pattern 110*p* is transferred to the SOG layer 60.

As illustrated in FIG. 6B, the SOC layer 50 is subsequently etched by a method such as RIE by using the SOG pattern 60*p* as a mask to form an SOC pattern 50*p* in which the SOG pattern 60*p* is transferred to the SOC layer 50. Because the resist pattern 110*p* and the SOC layer 50 are made of a similar material for example, at least the resist pattern 110*p* disappears by the etching process of the SOC layer 50.

As illustrated in FIG. 6C, the processed layer 40 is further etched by a method such as RIE by using the SOC pattern 50*p* as a mask to form a pattern 40*p* in which the SOC pattern 50*p* is transferred to the processed layer 40. After that, the SOC pattern 50*p* is removed by an ashing process etc. using oxygen plasma.

After this, when the processed layer 40 is an insulating layer etc., for example, a conducting layer etc. are embedded in the pattern 40*p* of the processed layer 40 to form wiring, via holes, or the like. The semiconductor device of the embodiment is manufactured by repeating the above processing multiple times.

Note that it has been explained that the processed layer 40 is an insulating layer etc. in the above example but the processed layer 40 may be another type of layer such as a conducting layer and a semiconductor layer. Moreover, it has been explained that the SOC layer 50 and the SOG layer 60 are formed on the processed layer 40 and then the resist pattern 110*p* targeted for the imprinting process is formed, but the layer structure to be used when processing the processed layer 40 is not limited to the above.

Meanwhile, as described above, the shot areas SHe that are arranged in the area excluding the outer periphery of the wafer 20 and do not have a missing part and the shot areas SHc that are arranged on the outer periphery of the wafer 20 and have the missing part are provided on the wafer 20. Moreover, because the convex area 21 including the plurality of layers 30 with the edge-bead removal process may be eccentric to the entire of the plurality of shot areas SH, the shape and planar dimension of the shot area SHc may vary for each the wafer 20.

On the other hand, the drop recipe of the imprinting apparatus 1 is prescribed based on the shot areas SHe without a missing part, for example. Therefore, in the imprinting process of the embodiment, when performing the process for the shot areas SHc having the missing part, the controller 90 of the imprinting apparatus 1 performs correction of the drop recipe in accordance with the individual shot areas SHc.

FIGS. 7A to 7F are schematic diagrams explaining a method of generating the drop recipe by the imprinting apparatus 1 according to the embodiment. The method of generating the drop recipe is performed by the controller 90 in the imprinting apparatus 1, for example, and the drop recipe is corrected for the individual shot areas SHc.

FIGS. 7A to 7E are based on an example of an image 83*a* obtained by capturing the predetermined shot area SHc provided on the wafer 20 by the imaging device 83. In more detail, FIGS. 7A to 7E illustrate the shot area SHc arranged near an outer edge 20*e* of the wafer 20 at the top left of the page, for example. Thus, a portion of the shot area SH at the top left of the page protrudes outside the step 22. As described above, the portion protruding outside the step 22 is a missing part of the shot area SHc. In this case, the imprinting process is performed on the shot area SHc inside the step 22.

Note that the right side of paper of the image 83*a* captured by the imaging device 83 illustrated in FIGS. 7A to 7E is identical with a line (diameter) passing through the center of the wafer 20.

Figure 7A:
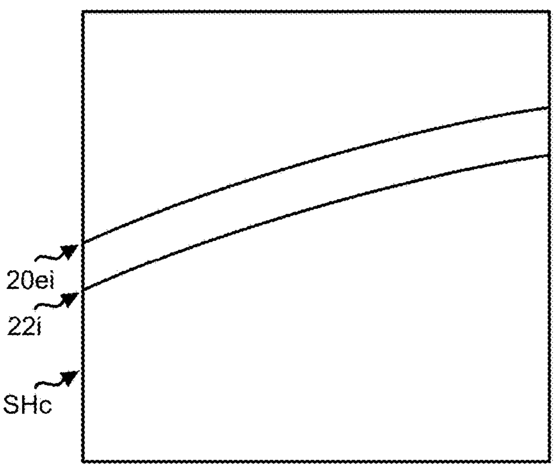
FIGS. 7A to 7F are schematic diagrams explaining a correction method of a drop recipe by the imprinting apparatus according to the embodiment.

As illustrated in FIG. 7A, based on the image 83*a* obtained by capturing the predetermined shot area SHc, the controller 90 of the imprinting apparatus 1 specifies the position of an outer edge 20*ei* of the wafer 20 and the position of a step 22*i* in the shot area SHc.

Figure 7D:
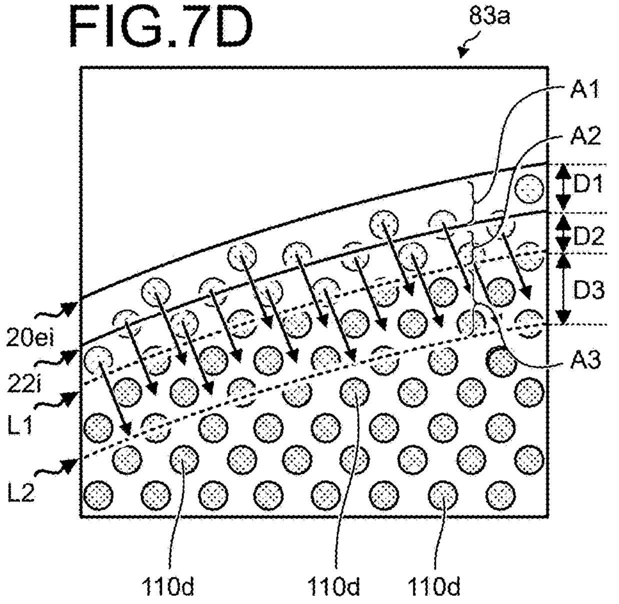
Figure 7B:
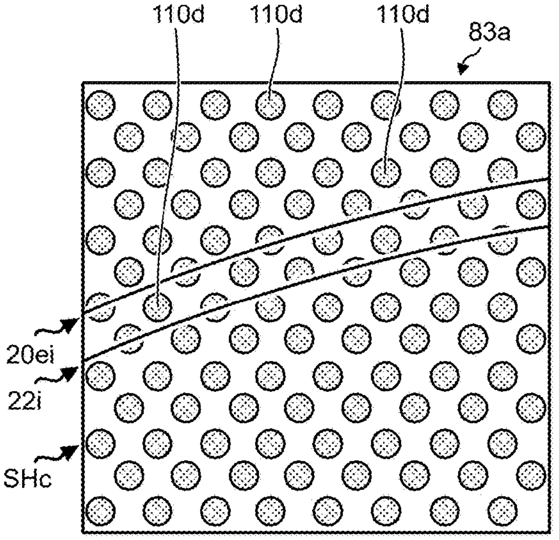
Figure 7E:
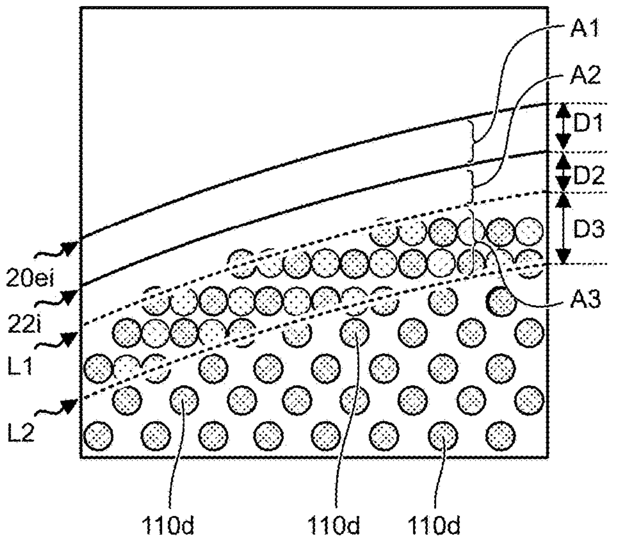
Figure 7C:
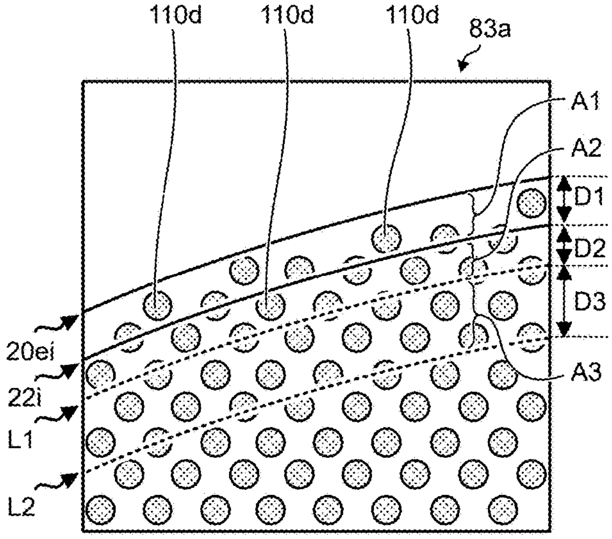
Figure 7F:
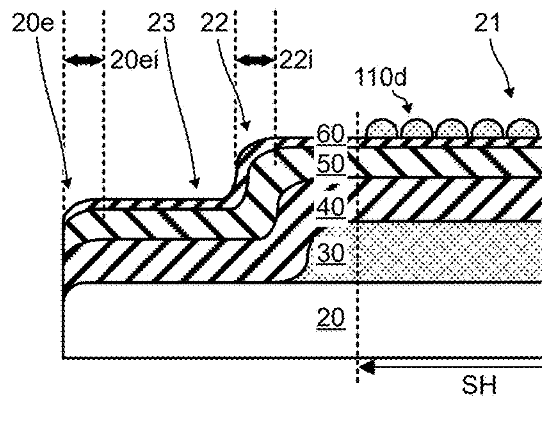

Herein, FIG. 7F illustrates an example of a relationship between the step 22*i* that is observed in the image 83*a* captured by the imaging device 83 and the above step 22 that is formed on the wafer 20 for the imprinting process.

As described above, when the step 22 having a slope-like shape is viewed from the imaging device 83 above the wafer 20, for example, a portion of a rounded corner of the step 22, that is, a curved portion having the highest curvature may be observed as a white line with a certain width, that is, the step 22*i* viewed from the imaging device 83.

Note that the relationship as described above also applies to the outer edge 20*e* of the wafer 20 described below. In other words, when the outer edge 20*e* of the wafer 20 including a bevel portion having a curved surface shape is viewed from the imaging device 83 above the wafer 20, the curved portion of the bevel portion may be observed as a white line with a certain width, that is, the outer edge 20*e* of the wafer 20 viewed from the imaging device 83.

Hereinafter, when there is no need to distinguish the step 22*i* that is observed by the imaging device 83 and the step 22 that is physically formed on the wafer 20, the steps may be simply referred to as the step 22. Moreover, when there is no need to distinguish the outer edge 20*ei* of the wafer 20 to be observed by the imaging device 83 and the physical outer edge 20*e* of the wafer 20, the outer edges may be simply referred to as the outer edge 20*e*. In this regard, however, the explanations of FIGS. 7A to 7E have been made on the step 22*i* and the outer edge 20*ei* that are observed by the image 83*a* as a line as described above in principle.

As illustrated in FIG. 7A, in the image 83*a* obtained by capturing the shot area SHc that is arranged near the outer edge 20*e* of the wafer 20 at the top left of the page, the outer edge 20*ei* and the step 22*i* of the wafer 20 at the top left of the page are observed, for example.

As illustrated in FIG. 7B, the controller 90 reads the drop recipe from a storage device etc., for example, and performs fitting to the shot area SHc. In the drop recipe, the plurality of droplets 110*d* take, for example, a staggered arrangement so that the droplets are dispersed and dropped with substantially uniform density over the entire of the shot area SHe without a missing part. Thus, the individual droplets 110*d* can be arranged with high density, and further the arrangement of the droplets 110*d* that are actually dropped onto the wafer 20 can have substantially uniform density within the predetermined variation.

In this regard, however, when the imprinting process target is the shot area SHc having a missing part, some of the droplets 110*d* are dropped outside of the step 22 or the outer edge 20*e* of the wafer 20 if the drop recipe based on the shot area SHe is applied to the target without change.

As illustrated in FIG. 7C, the controller 90 deletes, from the drop recipe, the droplets 110*d* that are dropped outside of the outer edge 20*ei* of the wafer 20. At this time, the droplets 110*d* to be deleted are determined based on information of the outer edge 20*ei* obtained from the image 83*a* captured by the imaging device 83.

Note that, in the actual drop recipe, the coordinate of the center point of the droplet 110*d* when viewed from the top surface of the wafer 20 is set as the dropping position of the droplet 110*d*. Therefore, according to the drop recipe, the droplets 110*d* of which the center point in FIG. 7B is located outside of the outer edge 20*ei* of the wafer 20 are deleted.

Additionally, as described above, the outside of the step 22 is an area not subject to the imprinting process. Moreover, it is considered that the droplets 110*d*, which are dropped extremely close to the step 22 even if the droplets are located inside of the step 22, protrude outside of the step 22 when the droplets are pressed and expanded by the template 10 for example. Therefore, the controller 90 performs correction of shifting, from these areas, the dropping positions of the droplets 110*d* to the further inside area of the wafer 20.

In more detail, based on the position of the outer edge 20*ei* of the wafer 20 and the position of the step 22*i* specified from the image 83*a* as described above, the controller 90 sets an area A1 between the step 22*i* and the outer edge 20*ei* of the wafer 20, for example. At this time, the area A1 is determined based on information of the step 22*i* and the outer edge 20*ei* obtained from the image 83*a* captured by the imaging device 83. This is similarly applied to areas A2 and A3 described below.

Moreover, at this time, it is assumed that a distance between the step 22*i* and the outer edge 20*ei* of the wafer 20 is a distance D1. Note that the distance D1 between the step 22*i* and the outer edge 20*ei* of the wafer 20 is a distance on a line (diameter) passing through the center of the wafer 20. This is similarly applied to distances D2 and D3 described below.

The controller 90 sets the predetermined distance D2 and a position L1 inside the wafer 20 from the specified position of the step 22*i* as described above, and sets the area A2 between the step 22*i* and the position L1. Furthermore, the controller 90 sets the predetermined distance D3 and a position L2 inside the wafer 20 from the set position L1, and sets the area A3 between the position L1 and the position L2.

As illustrated in FIG. 7D, the controller 90 performs correction of shifting the dropping positions of the droplets 110*d* to be arranged in the areas A1 and A2 into the area A3 on the drop recipe. Even at this time, the dropping positions of the droplets 110*d* of which the coordinates of the center points viewed from the top surface of the wafer 20 protrude outside of the step 22*i* are a shift target.

Herein, when pressing the template 10, the radii of the crushed droplets 110*d* can be calculated by the following Expression (1).

$$R = sqrt(V/\pi/RLT) \quad (1)$$

Herein, R: Radius of droplet after pressing template, V: Volume of droplet, and RLT (residual layer thickness): Resist residual film thickness.

Moreover, in order to prevent the crushed droplets 110*d* from protruding outside of the step 22, the area A2 may be set to satisfy the following Expression (2) so that the width of the area A2, that is, the distance D2 between the step 22*i* and the position L1 is greater than the radii of the crushed droplets 110*d*.

$$D2 > R \quad (2)$$

Moreover, when the droplets 110*d* are simply removed from the areas A1 and A2, resist material to perform the imprinting process on the shot area SHc inside the step 22 is insufficient. In that case, the closer the area is to the step 22, the less resist material is, and the resist layer 110*s* (see FIG. 4C) to be formed inside the step 22 cannot be caused to reach extremely close to the step 22.

Therefore, as described above, the present embodiment makes up for the shortage of resist material by moving the droplets 110*d* in the areas A1 and A2 to the area A3. On this occasion, when the area A3 is too wide compared with the areas A1 and A2, it is difficult to solve the shortage of resist material near the step 22. Therefore, it is preferable to set the area A3 so that the widths of the areas A1 to A3, namely, the distance D1 between the step 22*i* and the outer edge 20*ei* of the wafer 20, the distance D2 between the step 22*i* and the position L1, and the distance D3 between the position L1 and the position L2 satisfy the following Expression (3).

$$D1 + D2 \geq D3 \quad (3)$$

Thus, the planar dimension of the area A3 can be made smaller than the total planar dimension of the area A1 and the area A2, and the resist layer 110*s* can be caused to reach extremely close to the step 22 by preventing the resist material from being insufficient near the step 22.

As illustrated in FIG. 7E, a correction recipe is generated by the above correction. In the correction recipe, by shifting the dropping positions of the droplets 110*d* in the areas A1 and A2 to the area A3, the arrangement density of the droplets 110*d* in the area A3 becomes higher than that of an area inside the area A3.

Note that it is preferable that the dropping positions of the individual droplets 110*d* in the areas A1 and A2 are shifted to the coordinates of gaps between the droplets 110*d* arranged in the area A3 from the beginning. Moreover, the dropping positions of the individual droplets 110*d* in the areas A1 and A2 may be shifted by substantially the same distance, or may be shifted by different distances for the droplets 110*d*.

When performing the imprinting process on the shot area SHc having the missing part, the controller 90 of the imprinting apparatus 1 generates a correction recipe based on the previously held drop recipe, and executes the imprinting process on the shot area SHc in accordance with the generated correction recipe, as described above.

(Imprinting Method)

Figure 8:
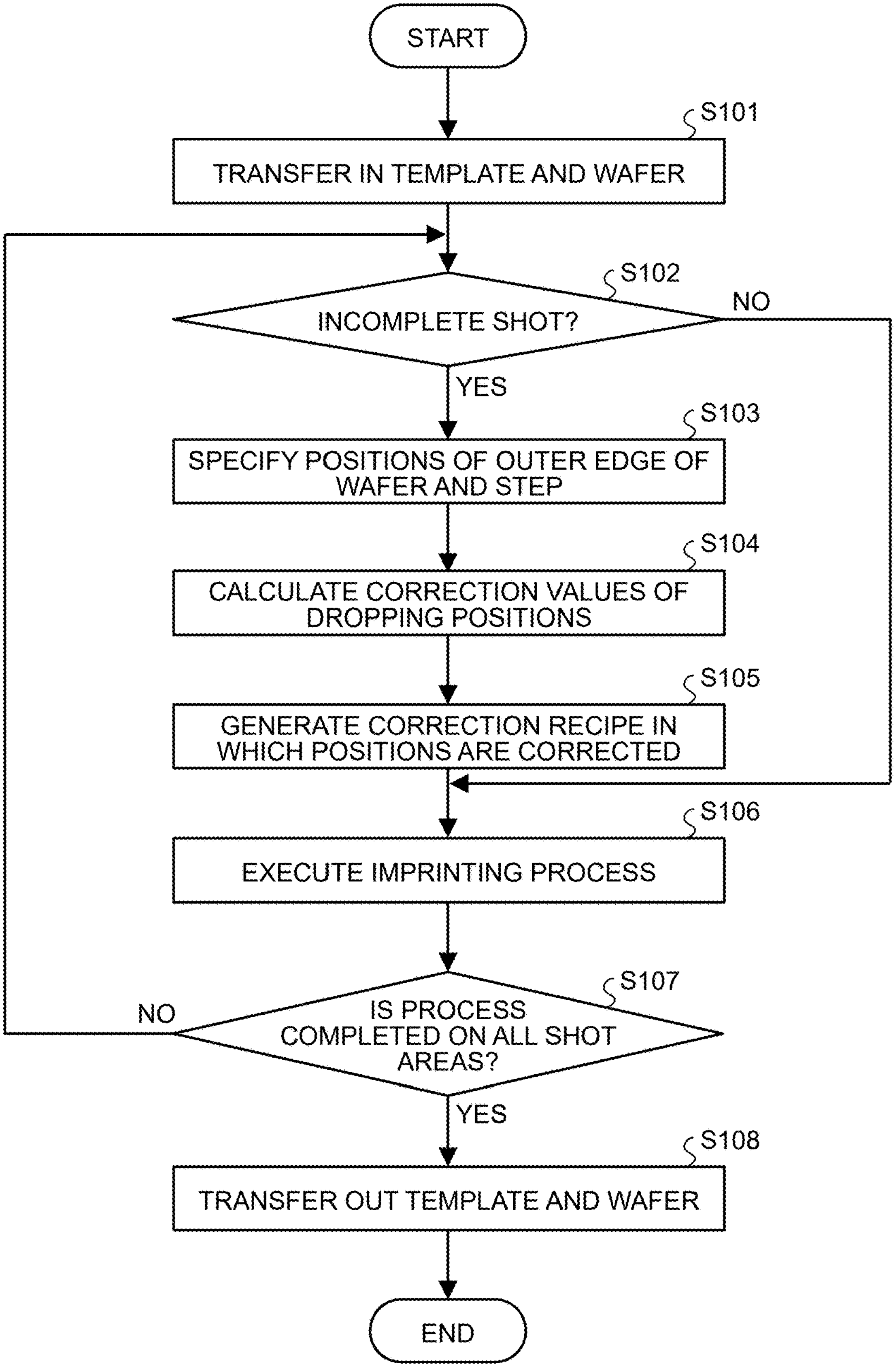
FIG. 8 is a flowchart illustrating an example of procedures of the imprinting process by the imprinting apparatus according to the embodiment.

Next, an imprinting method according to the embodiment will be described with reference to FIG. 8. FIG. 8 is a flowchart illustrating an example of procedures of the imprinting process by the imprinting apparatus 1 according to the embodiment. Note that the controller 90 of the imprinting apparatus 1 previously acquires shot map information etc. of the wafer 20 from, for example, a design device that designs the wafer 20 before starting the imprinting process for the wafer 20.

As illustrated in FIG. 8, the controller 90 controls to transfer the template 10 and the wafer 20 into the imprinting apparatus 1 (Step S101). The controller 90 determines whether the shot area SH for the imprinting process is the shot area SHc having the missing part with reference to the shot map information etc. of the wafer 20, for example (Step S102).

When the imprinting process target is the shot area SHc (Step S102: Yes), the controller 90 captures an image of the shot area SHc by the imaging device 83, for example, and specifies positions of the step 22*i* and the outer edge 20*ei* of the wafer 20 in the shot area SHc based on the captured image (Step S103).

Moreover, based on the specified positions of the step 22*i* and the outer edge 20*ei* of the wafer 20, the controller 90 calculates correction values of dropping positions of some of the droplets 110*d* in the drop recipe (Step S104). Furthermore, the controller 90 generates a correction recipe in which the dropping positions of these droplets 110*d* are corrected (Step S105).

In other words, the processes of Steps S103 to S105 correspond to the above procedures illustrated in FIGS. 7A to 7F.

When the imprinting process target is the shot area SHe without a missing part (Step S102: No), the processes of Steps S103 to S105 are skipped.

The controller 90 executes the imprinting process on the shot area SH to be processed based on the previously set drop recipe when the imprinting process target is the shot area SHe and based on the correction recipe obtained by correcting the drop recipe when the imprinting process target is the shot area SHc (Step S106).

In other words, the process of Step S106 corresponds to the above procedures illustrated in FIGS. 4A to 5B.

When the imprinting process for the shot area SH is completed, the controller 90 determines whether the imprinting process is completed on all the shot areas SH provided on the wafer 20 with reference to the shot map information etc. of the wafer 20, for example (Step S107).

The controller 90 repeats the processes from Step S102 when there is the unprocessed shot area SH (Step S107: No). When the process for all the shot areas SH is completed (Step S107: Yes), the controller 90 controls to transfer out the template 10 and the wafer 20 from the imprinting apparatus 1 (Step S108).

As described above, the imprinting process by the imprinting apparatus 1 according to the embodiment is completed.

(Summarization)

In the manufacturing process of the semiconductor device, the imprinting process by the imprinting apparatus may be performed. Some of the plurality of shot areas provided on the wafer are incomplete shots arranged on the outer periphery of the wafer. In the imprinting process for the incomplete shots, various problems may occur. Some problems will be described with reference to FIGS. 9A to 9F.

FIGS. 9A to 9F are cross-sectional views illustrating procedures of an imprinting process by the imprinting apparatus according to a comparative example.

Figure 9A:
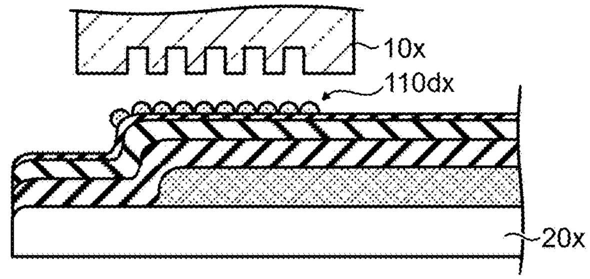
FIGS. 9A to 9F are cross-sectional views illustrating procedures of an imprinting process by the imprinting apparatus according to a comparative example.
Figure 9D:
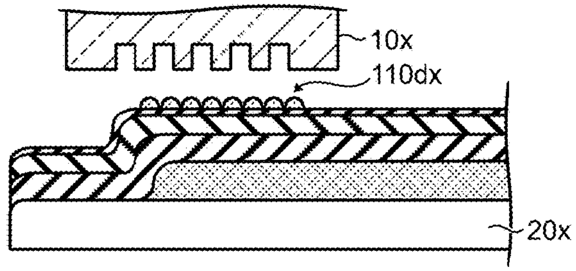
Figure 9B:
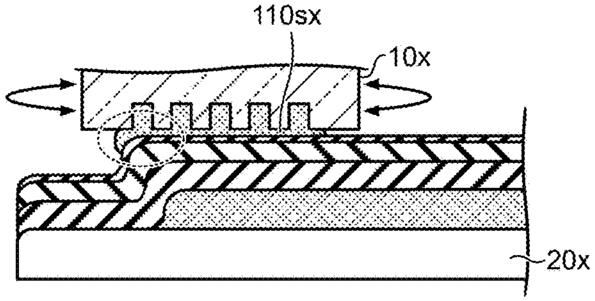
Figure 9E:
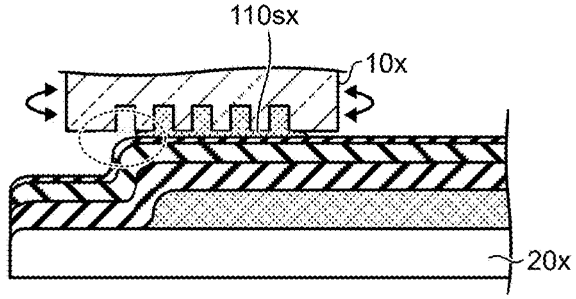
Figure 9C:
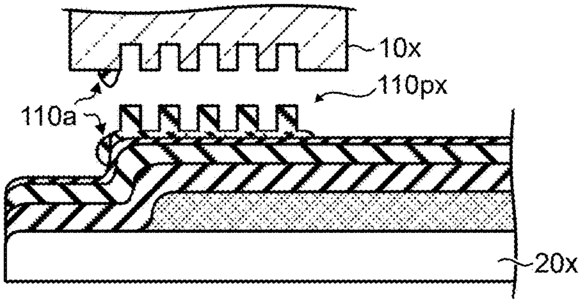

FIGS. 9A to 9C illustrate an example of a case where the imprinting process of applying the normal drop recipe to the incomplete shot is performed. As illustrated in FIG. 9A, in the imprinting process according to the comparative example, droplets 110*dx* are also dropped onto an area, including a step, near the step by applying the normal drop recipe for example. As illustrated in FIG. 9B, when a template 10*x* is pressed on the droplets 110*dx*, the excess resist material protrudes from the step and a resist layer 110*sx* that expands to the outside of the step is formed, as illustrated by the oval in the present drawing. As illustrated in FIG. 9C, after a resist pattern 110*px* is formed by the resist hardening, resist materials 110*a* may be attached to the step of a wafer 20*x* or the template 10*x* when releasing the template 10*x*. Such the resist materials 110*a* may cause particles later.

Figure 9F:
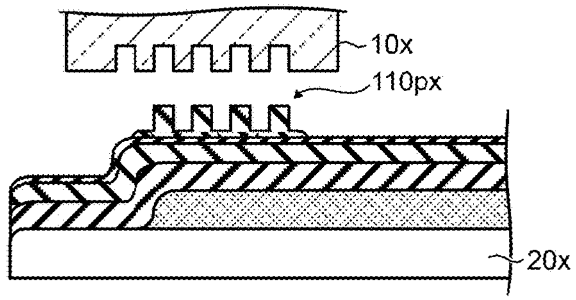

FIGS. 9D to 9F illustrate an example of a case where the imprinting process is performed on the incomplete shot by using the drop recipe in which droplets to be dropped outside the step are removed. As illustrated in FIG. 9D, in the imprinting process according to the comparative example, the number of the droplets 110*dx* is reduced near the step, for example. As illustrated in FIG. 9E, when the fine alignment is performed by pressing and sliding the template 10*x* on the droplets 110*dx*, a shear force caused by sliding the template 10*x* becomes higher near the step where the resist material is insufficient. Thus, the sliding of the template 10*x* is limited, and it is difficult to perform position alignment between the wafer 20*x* and the template 10*x* with high accuracy. As the result of the above, as illustrated in FIG. 9F, position deviation may occur in the resist pattern 110*px* formed on the wafer 20*x*.

As described above, in the imprinting process for the incomplete shot, the excess resist material may be attached to the wafer 20*x* or the template 10*x* to cause particles when the excess resist material is dropped near the step. On the other hand, when an amount of resist material to be dropped near the step is reduced, the resist material near the step is insufficient and thus the position deviation easily occurs in the resist pattern 110*px*.

As described above, the step that goes around the outer periphery of the wafer 20*x* may be eccentric to the entire of the plurality of shot areas, and shapes and planar dimensions of incomplete shots of the individual wafers 20 may be different variously. This promotes the various defects caused by the incomplete shots.

According to the method of generating the drop recipe of the embodiment, for the shot area SHc including the step 22 among the plurality of shot areas SH provided on the wafer 20, changing is performed on the drop recipe in which the dropping positions of the plurality of droplets 110*d* onto the wafer 20 are set with uniform density, in such a manner that the droplets 110*d* do not exist in the areas A1 and A2 prescribed by information obtained from the captured image, and the density of the droplets 110*d* located near the inside of the position L1 inside of the step 22*i* is higher than the density of the droplets 110*d* located other than near the inside of the position L1 within the inside of the position L1.

As described above, by preventing the droplets 110*d* from being dropped onto the area A1 outside the step 22*i* that is not subject to the imprinting process as well as the area A2 that is located inside of the step 22*i* by the constant distance D2 from the step 22*i*, the droplets 110*d* in the area A2 are prevented from protruding to the outside of the step 22 when the droplets 110*d* in the area A2 are crushed by the template 10. Thus, it is possible to suppress the occurrence of defects in the shot area SHc, such as the occurrence of a particle source such that the resist material 110*a* is attached to the template 10 or the wafer 20, for example.

Moreover, because the droplets 10*d* are not dropped onto the areas A1 and A2 and also the density of the droplets 110*d* near the inside of the position L1 is increased, it is possible to suppress the shortage of resist material near the step 22. Therefore, it is possible to increase the accuracy of the fine alignment by sliding of the template 10, and further to suppress the position deviation of the resist pattern 110*p*.

According to the method of generating the drop recipe of the embodiment, the position of the step 22*i* and the position of the outer edge 20*ei* of the wafer 20 in the shot area SHc are specified when changing the drop recipe.

As described above, in the imprinting process, by specifying the positions of the step 22*i* and the outer edge 20*ei* of the wafer 20 in the individual shot areas SHc from the captured image, it is possible to appropriately drop the droplets 110*d* in accordance with the individual shot areas SHc.

According to the method of generating the drop recipe of the embodiment, the changing the drop recipe includes shifting the dropping positions of the droplets 110*d* located in the areas A1 and A2 in the drop recipe before the changing to the area A3.

As described above, because the droplets 10*d* in the areas A1 and A2 are shifted to the area A3 inside of the areas A1 and A2 rather than just removing the droplets 10*d* in the areas A1 and A2, it is possible to suppress the shortage of resist material near the step 22. Therefore, it is possible to increase the accuracy of the fine alignment by sliding of the template 10, and further to suppress the position deviation of the resist pattern 110*p*.

According to the method of generating the drop recipe of the embodiment, the area A2 is set so that the distance D1 is greater than the radius of each of the plurality of droplets 110*d* after the template 10 for the imprinting process is pressed on the plurality of droplets 110*d*. Thus, when the droplets are crushed by the template 10, the droplets 110*d* can be more surely prevented from protruding to the outside of the step 22.

According to the method of generating the drop recipe of the embodiment, the area A3 is set so that the sum of the distance D1 and the distance D2 between the step 22*i* and the outer edge 20*ei* of the wafer 20 prescribed by the information of the captured image is equal to or greater than the distance D3. As described above, by adding the droplets 110*d* in the areas A1 and A2 to the area A3 narrower than the total planar dimension of the areas A1 and A2, the shortage of resist material near the step 22 can be further suppressed.

According to the method of generating the drop recipe of the embodiment, the step 22 goes around the outer periphery of the wafer 20, and the values of the distance D3 are respectively different for the two or more shot areas SHc including the step 22. In other words, the wafer 20 includes the convex area 21 with a protruding central portion bordering on the step 22, and the convex area 21 is eccentric to the wafer 20 when viewed from the top of the wafer 20. As described above, because the correction recipe is generated for the wafer 20 with eccentricity in accordance with the individual shot areas SHc, it is possible to appropriately drop the droplets 110*d*.

According to the method of manufacturing the semiconductor device of the embodiment, the photoresist layer 100 for forming the step 22 is removed by irradiating exposure light to the outer periphery of the wafer 20 while rotating the wafer 20 and exposing and developing the photoresist layer 100 on the outer periphery of the wafer 20 by a predetermined width. Alternatively, the photoresist layer 100 is removed by exposing and developing the photoresist layer 100 and then discharging the removal liquid of the photoresist layer 100 to the outer periphery of the wafer 20 while rotating the wafer 20 to dissolve the photoresist layer 100 on the outer periphery of the wafer 20 by the predetermined width.

Eccentricity as described above occurs by the edge-bead removal process carried out in this way, and thus the shapes and planar dimensions of the shot areas SHc may be different for each the wafer 20 and for each the shot area SHc. However, as described above, because the correction recipe is generated in accordance with the individual shot areas SHc, it is possible to appropriately drop the droplets 110*d*.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of generating a drop recipe that is used for an imprinting process on a substrate including a step on an outer periphery, the method comprising:

acquiring first information indicating a position of the step and second information indicating a position of an outer edge of the substrate, in a first shot area including the step among a plurality of shot areas provided on the substrate;

setting third information indicating a first area between the step and the outer edge of the substrate based on the first information and the second information acquired;

setting fourth information indicating a second area between the step and a first position located inside of the substrate by a first distance from the step based on the first information; and changing the drop recipe, in which dropping positions of a plurality of droplets onto the substrate are set to uniform density, in such a manner that droplets do not exist in the first and second areas prescribed by the third information and the fourth information, and a density of droplets located near an inside of the first position is higher than a density of droplets located other than near the inside of the first position within the inside of the first position.

2. The method of generating the drop recipe according to claim 1, wherein changing the drop recipe includes:

setting fifth information indicating a third area between the first position and a second position that is located further inside of the substrate by a second distance from the first position; and shifting dropping positions of the droplets located in the first and second areas in the drop recipe to be changed to the third area.

3. The method of generating the drop recipe according to claim 2, wherein the fourth information and the fifth information are set so that a sum of the first distance and a third distance is equal to or greater than the second distance, the third distance being a distance between the step and the outer edge of the substrate prescribed by the first information and the second information.

4. The method of generating the drop recipe according to claim 3, wherein the step surrounds the outer periphery of the substrate, the substrate is provided with two or more shot areas including the step among the plurality of shot areas, and values of the third distance are respectively different for the two or more shot areas including the step.

5. The method of generating the drop recipe according to claim 4, wherein the substrate includes a convex area where is a protruding central portion bounded by the step, and the convex area is eccentric to the substrate when viewed from a top of the substrate.

6. The method of generating the drop recipe according to claim 1, wherein the fourth information is set so that the first distance is greater than a radius of each of the plurality of droplets after a template is pressed on the plurality of droplets.

7. The method of generating the drop recipe according to claim 1, wherein the dropping positions are prescribed in the drop recipe to be changed so that the plurality of droplets are dropped at a predetermined periodic.

8. The method of generating the drop recipe according to claim 1, wherein the drop recipe to be changed is set based on a second shot area, whose entire area is located inside of the step, among the plurality of shot areas, and the dropping positions of the plurality of droplets are set to uniform density over the entire area of the second shot area.

9. The method of generating the drop recipe according to claim 8, further comprising:

deleting droplets located outside of the outer edge among the plurality of droplets from the drop recipe to be changed.

10. The method of generating the drop recipe according to claim 1, wherein acquiring the first information and the second information is performed from an image captured by an imaging device.

11. An imprinting method that is executed by an imprinting apparatus on a substrate including a step on an outer periphery, a processor of the imprinting apparatus being configured to:

acquire first information indicating a position of the step and second information indicating a position of an outer edge of the substrate in a first shot area including the step among a plurality of shot areas provided on the substrate;

set third information indicating a first area between the step and the outer edge of the substrate based on the first information and the second information acquired;

set fourth information indicating a second area between the step and a first position located inside of the substrate by a first distance from the step based on the first information;

change a drop recipe, in which dropping positions of a plurality of droplets onto the substrate are set to uniform density, in such a manner that droplets do not exist in the first and second areas prescribed by the third information and the fourth information, and a density of droplets located near an inside of the first position is higher than a density of droplets located other than near the inside of the first position within the inside of the first position; and control a liquid dropping device of the imprinting apparatus so that the plurality of droplets are dropped onto the first shot area by using a changed drop recipe.

12. A method of manufacturing a semiconductor device including an imprinting process that is executed by an imprinting apparatus on a substrate including a step on an outer periphery, the method comprising:

forming a layer to be processed on the substrate;

performing the imprinting process on each of a plurality of shot areas provided on the substrate to form a mask pattern above the layer to be processed; and processing the layer to be processed by using the mask pattern, a processor of the imprinting apparatus being configured to:

acquire first information indicating a position of the step and second information indicating a position of an outer edge of the substrate in a first shot area including the step among the plurality of shot areas provided on the substrate;

set third information indicating a first area between the step and the outer edge of the substrate based on the first information and the second information acquired;

set fourth information indicating a second area between the step and a first position located inside of the substrate by a first distance from the step based on the first information;

change a drop recipe, in which dropping positions of a plurality of droplets onto the substrate are set to uniform density, in such a manner that droplets do not exist in the first and second areas prescribed by the third information and the fourth information, and a density of droplets located near an inside of the first position is higher than a density of droplets located other than near the inside of the first position within the inside of the first position; and control a liquid dropping device of the imprinting apparatus so that the plurality of droplets are dropped onto the first shot area by using a changed drop recipe.

13. The method of manufacturing the semiconductor device according to claim 12, wherein the step is formed by:

forming a photoresist layer covering an entire surface of the substrate;

removing the photoresist layer, while rotating the substrate, from the outer periphery of the substrate by a predetermined width; and removing a surface layer of the substrate on the outer periphery of the substrate that is exposed by the predetermined width by removing the photoresist layer.

14. The method of manufacturing the semiconductor device according to claim 13, wherein removing the photoresist layer includes exposing and developing the photoresist layer on the outer periphery of the substrate by the predetermined width.

15. The method of manufacturing the semiconductor device according to claim 13, wherein removing the photoresist layer includes discharging removal liquid of the photoresist layer to the outer periphery of the substrate to dissolve the photoresist layer on the outer periphery of the substrate by the predetermined width.

* * * * *